United States Patent
Choi

(10) Patent No.: US 6,198,164 B1
(45) Date of Patent: Mar. 6, 2001

(54) ULTRA HIGH DENSITY INTEGRATED CIRCUIT SEMICONDUCTOR PACKAGE AND METHOD FOR FABRICATING THE SAME

(75) Inventor: Shin Choi, Chungcheongbuk-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/191,193

(22) Filed: Nov. 13, 1998

(30) Foreign Application Priority Data

May 9, 1998 (KR) .................................................. 98-16630

(51) Int. Cl.[7] .................................................. H01L 23/34
(52) U.S. Cl. .......................... 257/723; 257/727; 257/730; 257/686; 257/777
(58) Field of Search ..................................... 257/723, 724, 257/727, 730, 685, 686, 777

(56) References Cited

U.S. PATENT DOCUMENTS

| | | | |
|---|---|---|---|
| 5,030,072 | * 7/1991 | Malhi et al. .......................... | 361/387 |
| 5,198,888 | 3/1993 | Sugano et al. ........................ | 257/686 |
| 5,362,986 | * 11/1994 | Anguilli et al. ...................... | 257/723 |
| 5,719,438 | * 2/1998 | Beilstein, Jr. et al. ............... | 257/686 |
| 5,910,682 | * 6/1999 | Song ..................................... | 257/685 |
| 5,940,277 | * 8/1999 | Farnworth et al. ................... | 257/678 |

* cited by examiner

Primary Examiner—David Hardy
Assistant Examiner—Lourdes Cruz
(74) Attorney, Agent, or Firm—Fleshner & Kim, LLP

(57) ABSTRACT

A semiconductor package and method for fabricating same is provided that includes a printed circuit board having an electrical circuit formed therein, a plurality of semiconductor chips vertically attached at fixed intervals to the printed circuit board and conductive connecting members that couple bonding pads on each semiconductor chip to pads on the printed circuit board. An encapsulation body encapsulates the semiconductor chips and the conductive connecting members above the printed circuit board. External connection terminals can be attached on a lower side of the printed circuit board for electrical connection to the semiconductor chips through the electrical circuit in the printed circuit board. The semiconductor package and method has increased mechanical and electrical reliability. The semiconductor package is preferably an ultra high density integrated circuit semiconductor package.

8 Claims, 18 Drawing Sheets

ULTRA HIGH DENSITY INTEGRATED CIRCUIT SEMICONDUCTOR PACKAGE AND METHOD FOR FABRICATING THE SAME

BACKGROUND OF THE INVENTION

1. Field of the Invention

The present invention relates to a semiconductor package and a method for fabricating the same, and more particularly, to a reduced size semiconductor package and a method for fabricating the same.

2. Background of the Related Art

In semiconductor industries, integrated circuit packaging techniques have been developed ceaselessly to satisfy the demand for smaller semiconductor devices. The development of a micron integrated circuit has integrated several millions of circuit elements into a single integrated circuit on a chip and increased the importance of integrated circuit packaging, which can improve an spatial efficiency.

FIGS. 1a–2 illustrate a related art semiconductor package stack T with an extended memory capacity in which Thin Small Outline Packages (TSOPs) P are stacked. The related art semiconductor package stack shown in FIGS. 1a–2 is fabricated using the following process.

First, two TSOPs P are provided, outer leads 18 of the TSOPs P are straightened, and ends of the outer leads 18 are cut. As shown in FIG. 2, the two TSOPs P are bonded together with polyimide adhesive 19 with their outer leads 18 aligned to each other. To connect the cut ends of the outer leads 18 on the TSOPs P, stacking rails 21 each with holes 20 are provided. The holes 20 in the stacking rails 21 and the ends of the outer leads 18 on the TSOPs P are aligned, and the outer leads 18 are inserted into the holes 20 in the rails 21. Then, upper parts of the rail 21 are bonded to an upper surface of the top TSOP P with the adhesive 19 to prevent movement of the rail 21 as shown in FIG. 1a. Solder paste is applied to upper parts of the holes 20 in the rail 21 and heated to bond the rails 21 with the outer leads 18. The two TSOP packages are mechanically and electrically connected through the foregoing process to complete a stacked package with a twofold memory capacity as shown in FIG. 1b. In the stacking type related art package shown in FIGS. 1a–2, the TSOPs P may be stacked as many needed for a required memory capacity. For example, stacking four TSOPs of 4M DRAM capacity will make a 16M DRAM package stack. FIG. 3 illustrates another related art stacking type package of a TAB package stacking, which is disclosed in U.S. Pat. No. 5,198,888.

However, the related art stack packages have various problems. In the related art package stacks, a stack of packages has problems in that the package stack is heavy, multiple stages of connections are exposed and the connections are weak incurring a lower mechanical reliability. Further, the lengthy signal line required for connection from chip 2' bonding pads to a PCB causes degradation of an electrical reliability, such as, signal delays, interferences, noises and the like in an implementation of a high speed device. The numerous bonding steps required in the fabrication process results in distortion of material and degradation of an interfacial bonding force between the chip 2' and encapsulation body 4'. Defective solder paste application results from the difficulty of applying solder paste 22 to narrow package lead pitches and causes defective insulation. In addition, the requirements for a separate rail 21 fabrication process, a separate upper and lower TSOP aligning process to attach the fabricated rails to the upper surface of the package, a separate alignment process in the case of outer lead insertion into the rail holes 21 and separate process to bond upper parts of the rails 21 with the upper surface of the package causes a complex package stack fabrication process. The additional stacking after completion of individual packaging requires even more process steps, and additional equipments beyond equipments required for individual packaging, all of which increase cost and increase the length of the fabrication process.

The above references are incorporated by reference herein where appropriate for appropriate teachings of additional or alternative details, features and/or technical background.

SUMMARY OF THE INVENTION

An object of the present invention is to provide a ultra high density integrated circuit semiconductor package and method for fabricating the same that substantially obviates one or more of the problems due to limitations and disadvantages of the related art.

Another object of the present invention is to provide a semiconductor package and method for manufacturing the same that has a high device packing density.

Another object of the present invention is to provide a semiconductor package and method for manufacturing the same that has a simple fabrication process.

Another object of the present invention is to provide a semiconductor package and method for manufacturing the same with an extremely short signal transmission path.

Another object of the present invention is to provide a semiconductor package and method for manufacturing the same that without outer leads.

Another object of the present invention is to provide a semiconductor package and method for manufacturing the same with increased mechanical and electrical reliability.

Another object of the present invention is to provide a semiconductor package and method for manufacturing the same that concurrently packages individual semiconductor chips with the package.

To achieve at least these objects and other advantages in a whole or in parts and in accordance with the purpose of the present invention, as embodied and broadly described, a semiconductor package includes a printed circuit board, wherein an electrical circuit is formed in the printed circuit board, a plurality of semiconductor chips substantially vertically attached to the printed circuit board, conductive members that respectively couple bonding pads on each the semiconductor chips to pads on the printed circuit board and an encapsulation body that packages the semiconductor chips and the conductive members above the printed circuit board.

To further achieve the above objects in a whole or in parts, and in accordance with the purpose of the invention, as embodied and broad described, a method for fabricating a semiconductor package includes die bonding a plurality of semiconductor chips on a printed circuit board, wherein the semiconductor chips are substantially vertically bonded to the printed circuit board, coupling bonding pads on the semiconductor chips and pads on the printed circuit board with conductive member, repeatedly performing the die bonding and the coupling steps in succession for of each of the plurality of semiconductor chips in the semiconductor package and packaging the semiconductor chips, bonding pads and conductive members with a resin.

To further achieve the above objects in a whole or in parts, and in accordance with the purpose of the invention, as embodied and broad described, a method for fabricating a semiconductor package includes applying a die bonding adhesive tape on a bottom of each of a plurality of grooves formed in an upper surface of a printed circuit board, positioning a first semiconductor chip to be wire bonded on the upper surface of the printed circuit board, wherein the first semiconductor chip is a current semiconductor chip, respectively bonding pads on the current semiconductor chip and pads on the printed circuit board with gold wires, turning over the current semiconductor chip with completed wire bonding to reverse an upper and a lower surfaces of the current semiconductor chip, positioning a successive semiconductor chip to be wire bonded on the upper surface of the printed circuit board, and wherein the successive semiconductor chip becomes the current semiconductor chip, repeating the respectively bonding pads step through the positioning a successive semiconductor chip step a prescribed number of times, standing all the wire bonded semiconductor chips vertical to the printed circuit board, applying heat and pressure to the semiconductor chips to cause bonding between the chips and a die bonding between the semiconductor chips and the printed circuit board and packaging the semiconductor chips on the printed circuit board with a resin to concurrently protect the semiconductor chips and the wire bonded portions of the semiconductor package.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 1b is a diagram that illustrates a side view of the semiconductor package of FIG. 1a;

FIGS. 6a–6g are diagrams that illustrate front views of a packing process of a stacking type semiconductor package of FIG. 4; wherein, FIG. 6a is a diagram that illustrates a perspective view of a printed circuit board;

FIG. 6b is a diagram that illustrates a front view of a first semiconductor chip in a groove in the printed circuit board of FIG. 6a;

FIG. 6c is a diagram that illustrates a front view of wire bonding with the first semiconductor chip;

FIG. 6d is a diagram that illustrates a front view of wire bonding a second semiconductor chip in succession to the first semiconductor chip;

FIG. 6e is a diagram that illustrates a front view after wire bonding;

FIG. 6f is a diagram that illustrates a front view after encapsulation with resin;

FIG. 6g is a diagram that illustrates a front view after mounting solder balls;

FIG. 15a–15h are diagrams that illustrate front or perspective views of a packaging process of the semiconductor package of FIG. 13; wherein, FIG. 15a is a diagram that illustrates a printed circuit board;

FIG. 15b is a diagram that illustrates a perspective view showing a first semiconductor chip on the printed circuit board for wire bonding;

FIG. 15c is a diagram that illustrates a perspective view of the first semiconductor chip after wire bonding;

FIG. 15d is a diagram that illustrates a perspective view showing wire bonding a second semiconductor chip with the first semiconductor chip turned over;

FIG. 15e is a diagram that illustrates a front view of bonding between chips;

FIG. 15f is a diagram illustrates preparation for pressing chips in FIG. 15e for the bonding between the chips;

FIG. 15g is a diagram that illustrates a perspective view of encapsulation of the chips in FIG. 15e;

FIG. 15h is a diagram that illustrates a front view of a semiconductor package after mounting solder balls;

DETAILED DESCRIPTION OF PREFERRED EMBODIMENTS

Figure 1A:
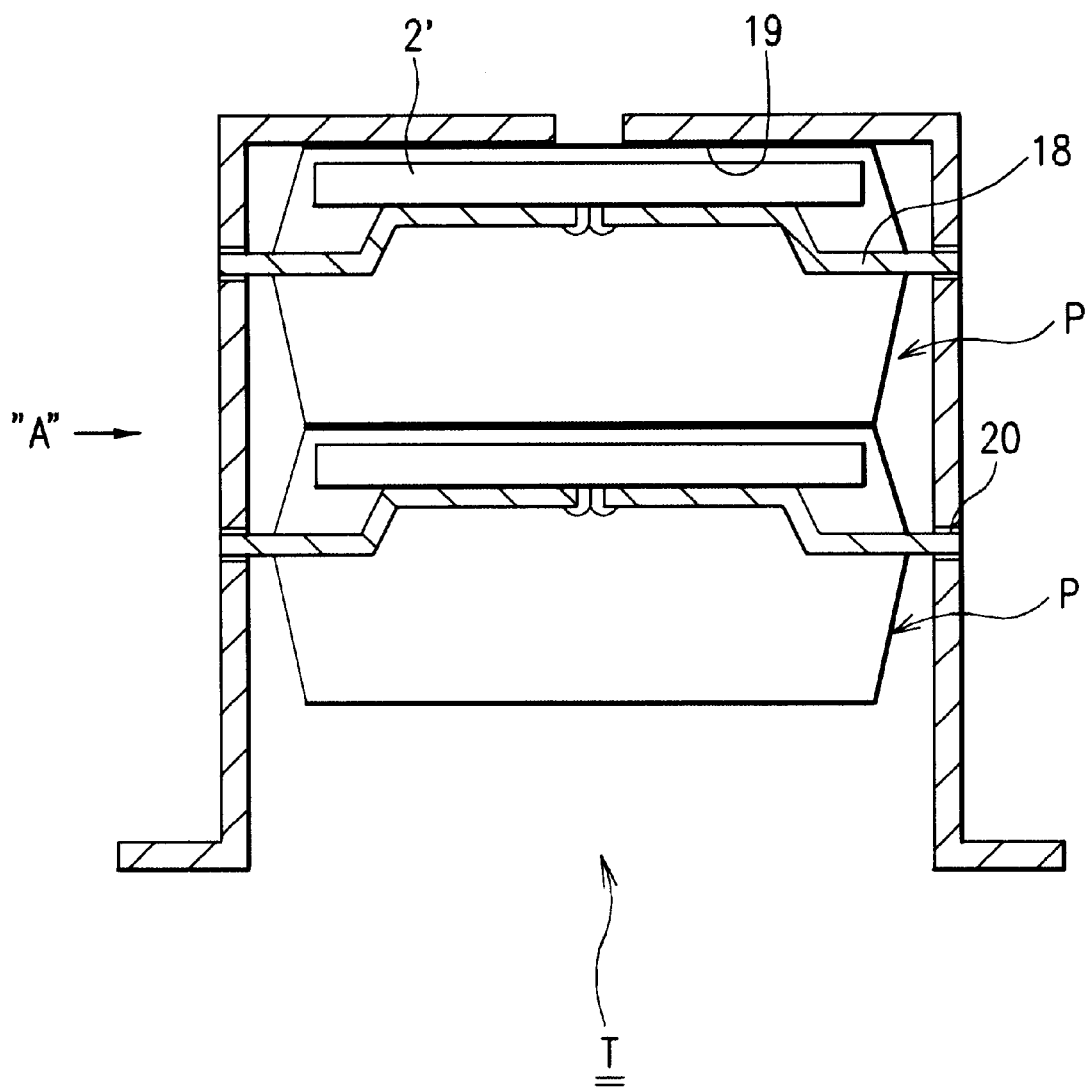
FIG. 1a is a diagram that illustrates a cross-sectional view of a related art stacking type semiconductor package.
Figure 1B:
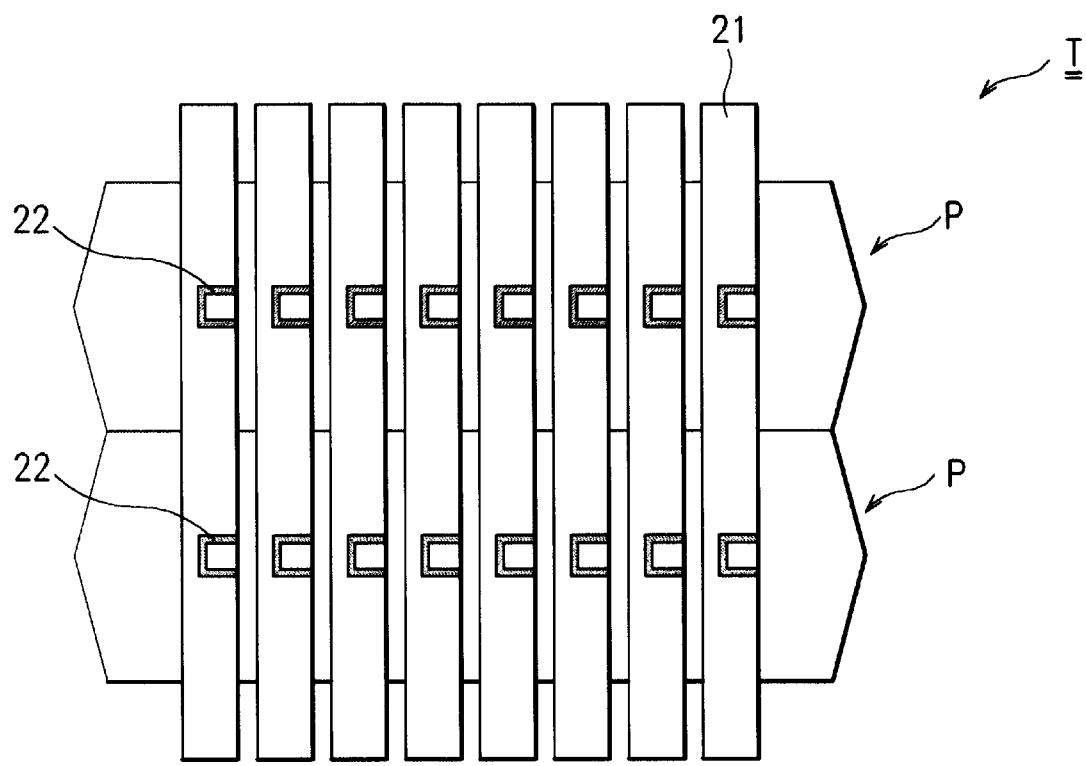
Figure 2:
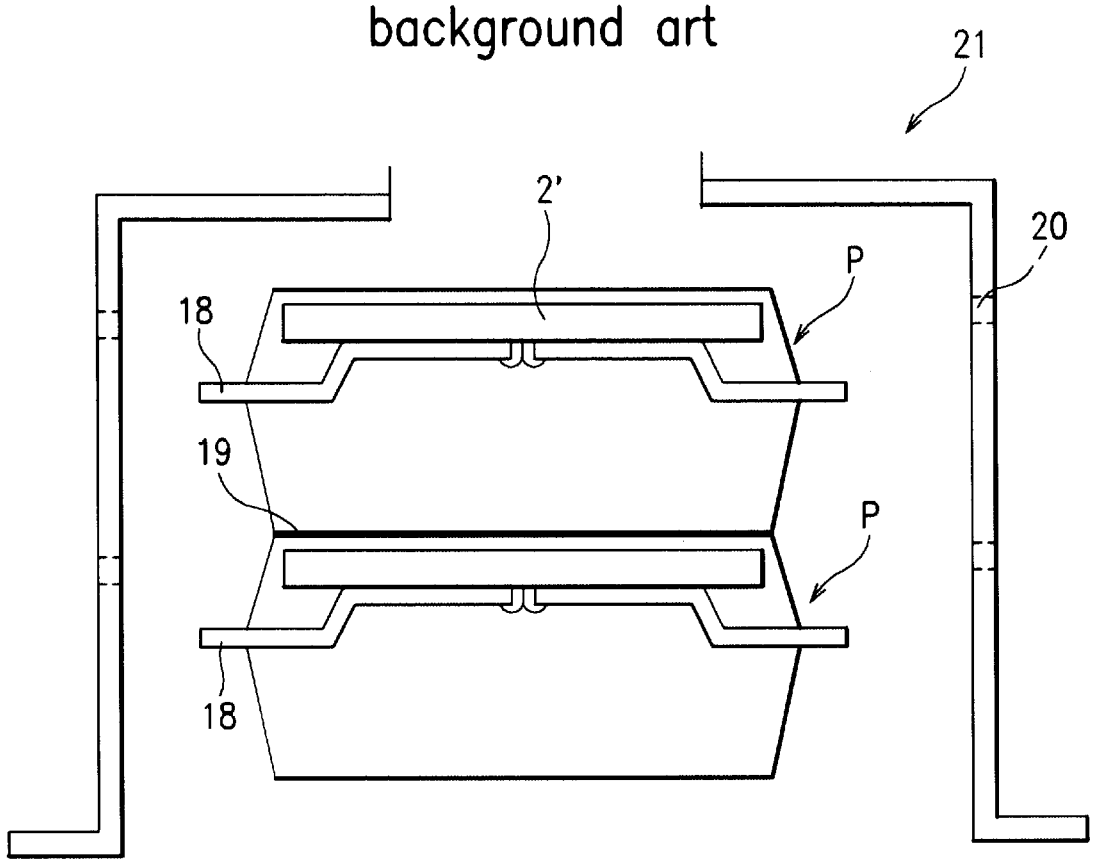
FIG. 2 is a diagram that illustrates a front view of the semiconductor package of FIG. 1a before fabrication.
Figure 3:
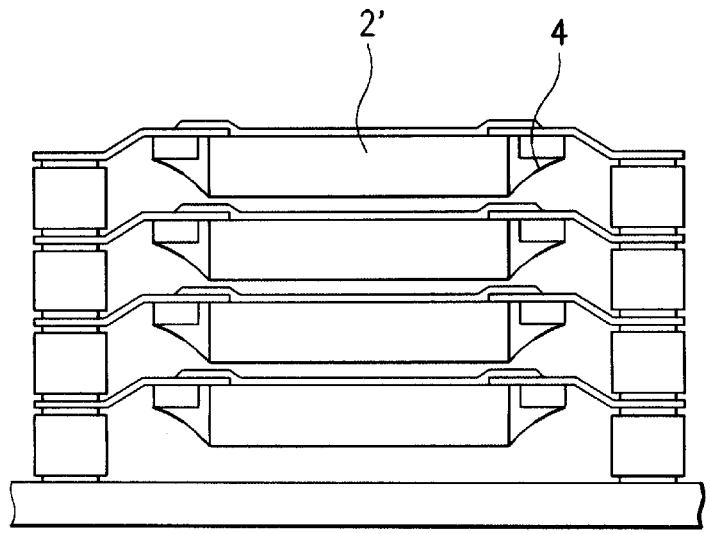
FIG. 3 is a diagram that illustrates a side view of an another related art stacking type semiconductor package before fabrication.
Figure 4:
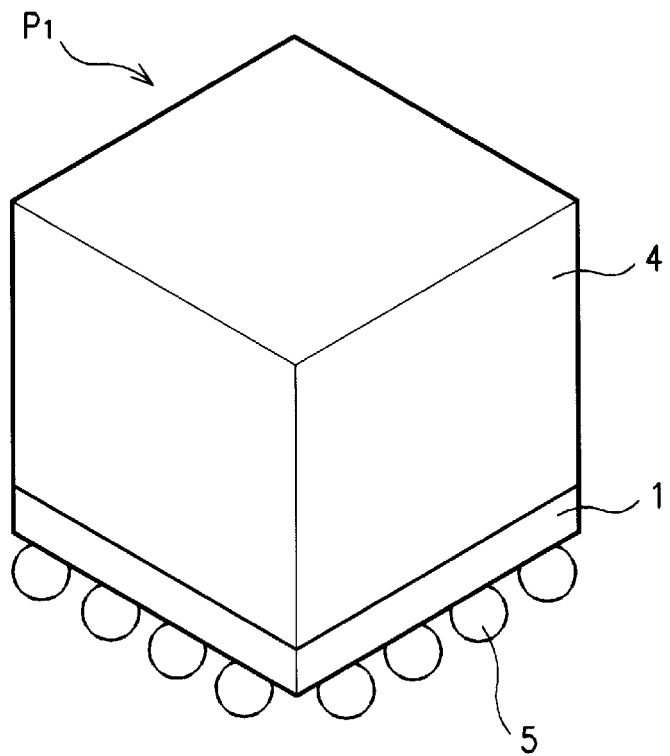
FIG. 4 is a diagram that illustrates a perspective view of a stacking type semiconductor package in accordance with a first preferred embodiment of the present invention.
Figure 5:
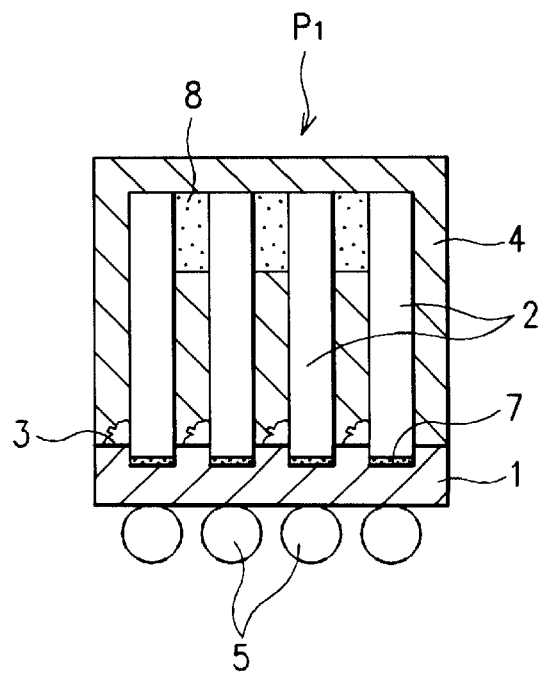
FIG. 5 is a diagram that illustrates a cross-sectional view of a stacking type semiconductor package of FIG. 4.

FIG. 4 is a diagram that illustrates a stacking type semiconductor package in accordance with a first preferred embodiment of the present invention, and FIG. 5 is a diagram that illustrates a cross section of FIG. 4. Referring to FIGS. 4 and 5, a semiconductor package $P_1$ in accordance with the first preferred embodiment includes a printed circuit board 1 having a electrical circuit formed therein, a plurality of semiconductor chips 2 spaced at fixed intervals standing vertical on and attached to the printed circuit board 1 and gold balls 3. The gold balls 3 are conductive connecting members for connecting bonding pads on each semiconductor chip 2 to pads on the printed circuit board 1. An encapsulation body 4 is for encapsulation of the semiconductor chips 2 and the conductive connecting members above the printed circuit board 1. Solder balls 5 of external connection terminals are attached on an underside of the printed circuit board 1 for electrical connection to the semiconductor chips 2 through the electrical circuit in the printed circuit board 1.

Figure 6A:
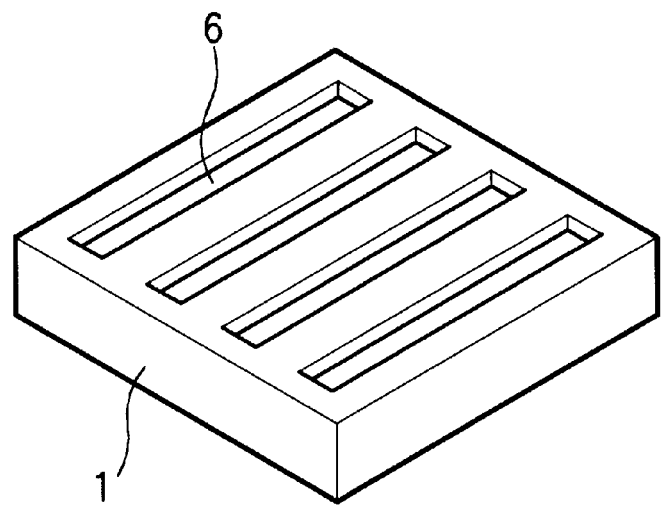
Figure 6B:
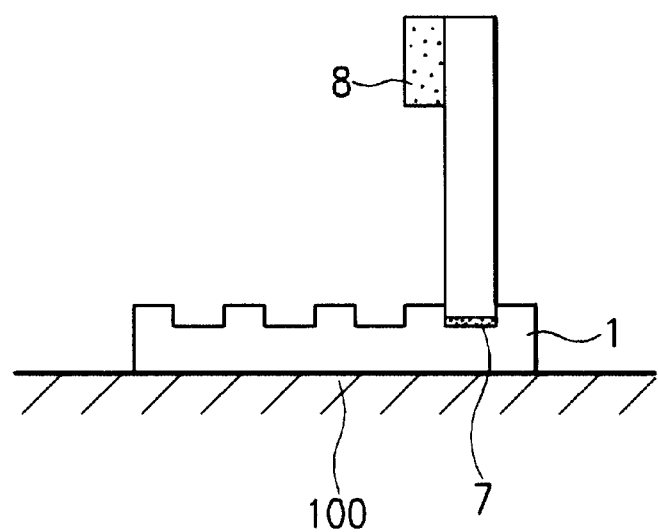
Figure 6C:
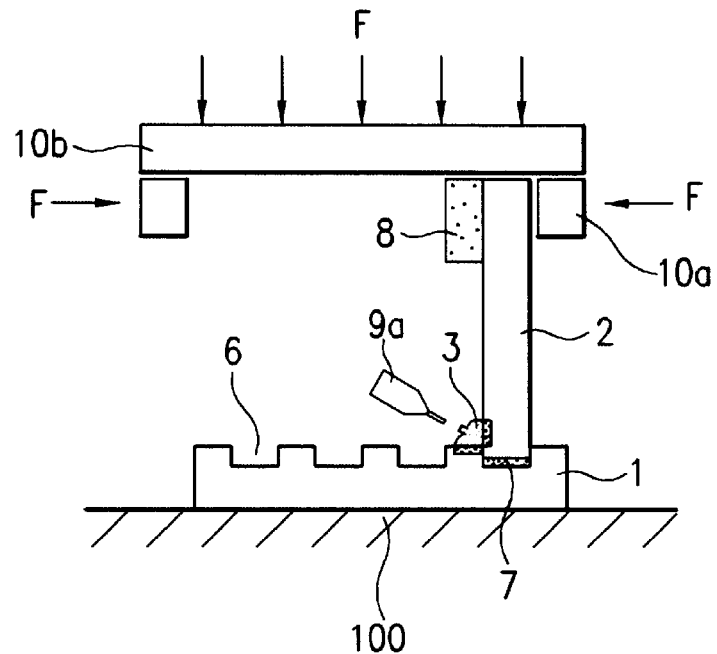

The printed circuit board 1 has grooves 6 as shown in FIG. 6A for planting the semiconductor chips 2 vertical to the printed circuit board 1. A die bonding adhesive tape 7 is preferably attached on a bottom of the groove 6. A depth from top of the die bonding adhesive tape 7 attached on the bottom of the groove 6 to an entrance of the groove 6 preferably should be identical to a distance from an edge of the semiconductor chip 2 to a bonding pad 11 on the semiconductor chip 2 so that the bonding pad 11 on the semiconductor chips 2 is exposed when the semiconductor chips are attached. That is, the plurality of grooves 6 formed in an upper surface of the printed circuit board 1 each receives a lower end of each semiconductor chip 2 and each preferably has a depth of 180~420 μm considering a depth of the attached die bonding adhesive tape 7. The die bonding adhesive tape 7 of polyamide has a thickness of 80~120 μm after being pressed down. An inter-chip adhesive tape 8 is between the chips 2 serves as a buffer that prevents direct contact between the chips 2. The die bonding adhesive tape 7 and the inter-chip adhesive tape 8, being adhesive on both faces, may be formed of the same material or, in view of cost, different materials because an adhesive force between the chips 2 may be lower than the die bonding adhesive force.

Packaging of the semiconductor package $P_1$ in accordance with the first preferred embodiment of the present invention will now be described with reference to FIGS. 6a to 6f. A printed circuit board 1 is provided as shown in FIG. 6a. The printed circuit board 1 is placed on an pre-heater plate 100 to heat the semiconductor chip 2 and the printed circuit board 1. The preheated semiconductor chip 2 is vertically inserted in a groove 6 in an upper surface of the board 1, and an upper pressing board 10b is placed on the semiconductor chip 2. The upper pressing board 10b presses down the semiconductor chip 2 to bond the semiconductor chip 2 on the die bonding adhesive tape 7 in one of the grooves 6 in the printed circuit board 1. A temperature of the pre-heat of the die bonding adhesive tape 7 is 200° C. and a peak temperature for hardening is 400° C.

Figure 6D:
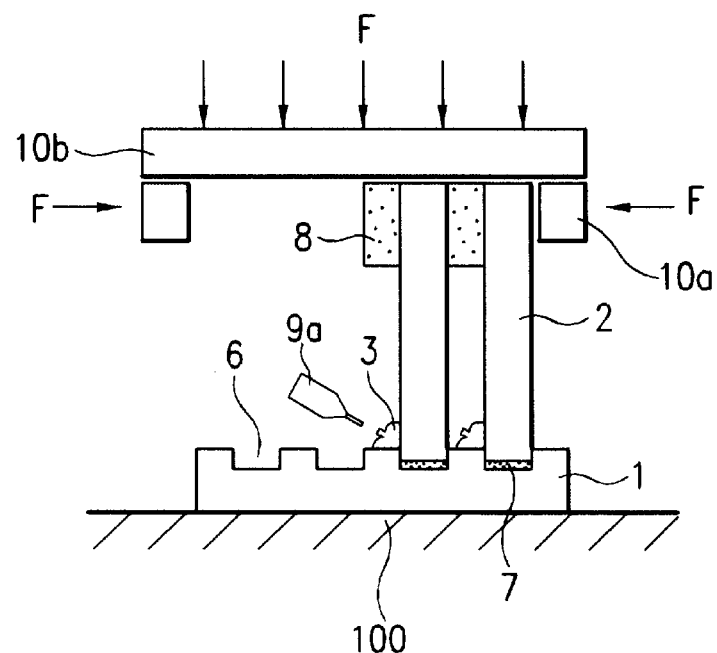
Figure 6E:
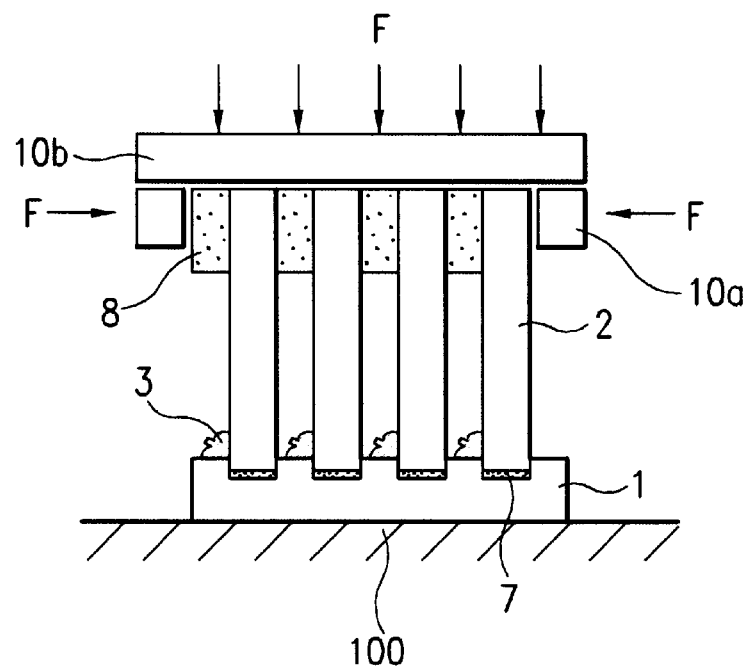
Figure 6F:
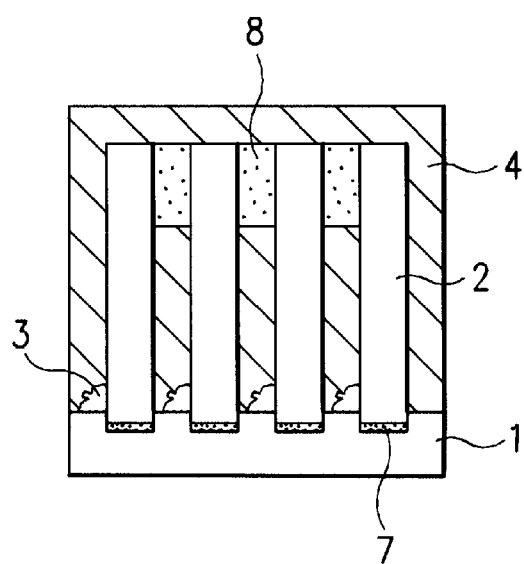
Figure 6G:
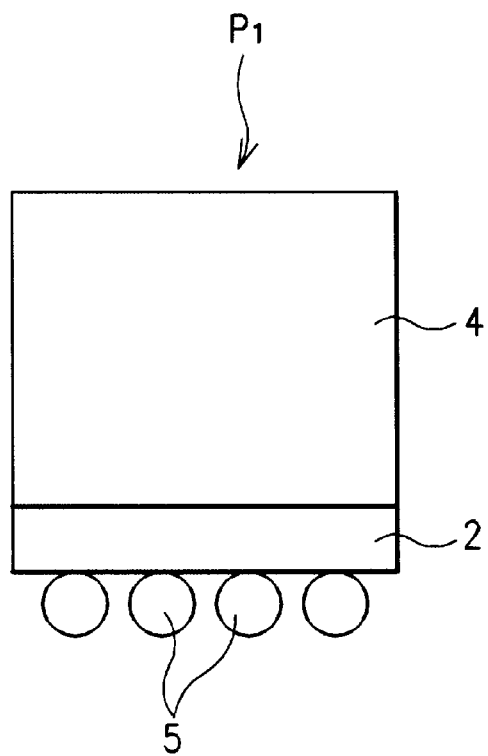

Bonding pads 11 on the semiconductor chip 2 and pads 12 on the board are bonded with gold balls 3, which act as connecting members, when a wire bonding capillary 9a is used to provide the gold balls to the board at preferably 45° from a board surface. As shown in FIGS. 6b to 6f, to avoid interfering with the advance and retract of the capillary 9a in bonding the gold balls 3, the die bonding and ball bonding for each of the semiconductor chips 2 is conducted one by one in sequence beginning from one side of the printed circuit board 1. That is, after finishing the die bonding and ball bonding for a first semiconductor chip 2, the die bonding and ball bonding for the next semiconductor chip 2 is repeatedly conducted, as many times as a number of the semiconductor chips 2 to be stacked. As shown in FIG. 6d, right and left compression plates 10a are provided for each of the semiconductor chips 2 for supporting and holding the semiconductor chips 2 to prevent the semiconductor chips 2 from being knocked over by an X-component (e.g., horizontal) of a pushing force applied to the semiconductor chips 2 from the capillary 9a.

Figure 7:
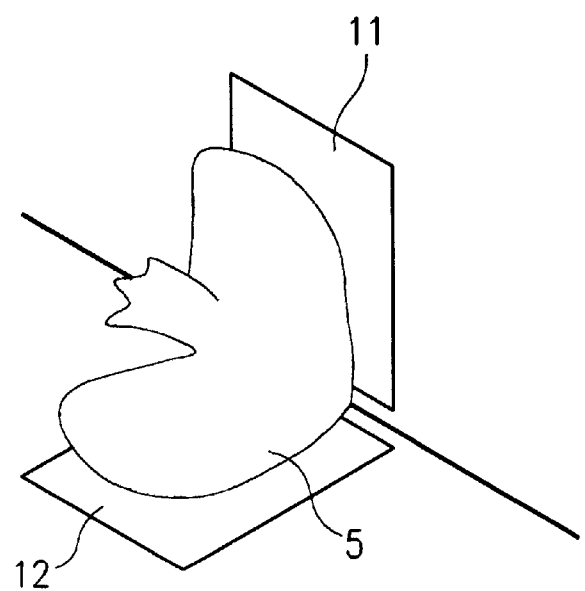
FIG. 7 is a diagram that illustrates an enlarged perspective view of a bond in FIG. 6c.

As shown in FIG. 7, in the ball bonding, the gold ball 3 from the capillary 9a bonds the bonding pad 11 on the semiconductor chip 2 and the pad 12 on the printed circuit board at the same time. Upon completion of the die bonding and the ball bonding for all the semiconductor chip 2 on the printed circuit board 1, the left and right compression plates 10a are used to press the semiconductor chips from both sides. The left and right compression plates 10a are used to bond between the chips 2 by means of an inter-chip adhesive tape 8 provided in advance at an upper part of the semiconductor chips 2. After the die bonding and ball bonding, the semiconductor chips 2 and the gold balls 3 are encapsulated with an encapsulate resin, which forms an encapsulating body 4 to protect the stacked semiconductor chips, gold balls and ball bonded portions. In the first preferred embodiment, the encapsulate resin fills spaces between the chips 2.

After completion of the encapsulation for the semiconductor chips 2 and the ball bonded portions, solder balls 5 are mounted on underside of the board. The solder balls 5 are preferably attached to the printed circuit board 1 at a last stage because if the solder balls 5, which have a low melting point in a range of 185° C., are mounted beforehand, the molding and tape bonding as well as handling are difficult. Thus, the package $P_1$, which is preferably an ultra high density integrated circuit package, can transmit an electrical characteristic of the semiconductor chips 2 to the solder balls 5 at underside of the package $P_1$ and, subsequently, to a main board (not shown) in which the package is mounted, through metallic wiring (not shown) on the upper surface of the board and circuits inside of the board.

Figure 8:
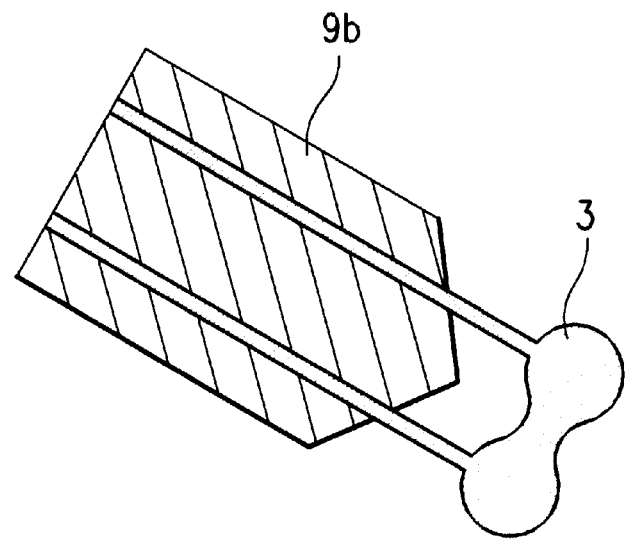
FIG. 8 is a diagram that illustrates cross-sectional view of a two way capillary.

FIG. 8 is a diagram that illustrates another embodiment of a capillary applicable to preferred embodiments of the present invention. A two way capillary 9b discharges two lines of gold wires at the same time to increase a volume of the gold balls 3.

Figure 9:
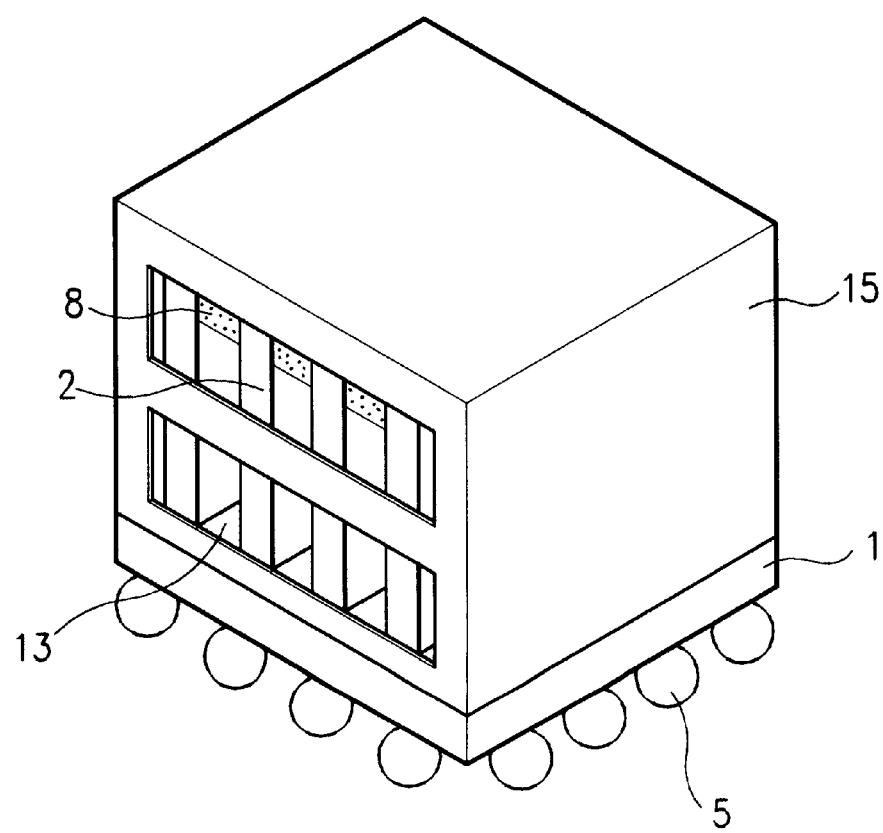
FIG. 9 is a diagram that illustrates a perspective view of a stacking type semiconductor package in accordance with a second preferred embodiment of the present invention.
Figure 10:
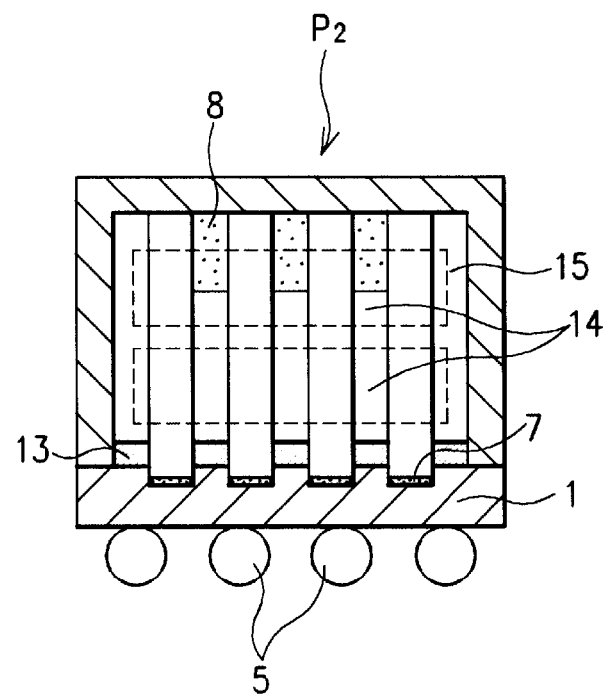
FIG. 10 is a diagram that illustrates a cross-sectional view the semiconductor package of FIG. 9.

Referring to FIGS. 9–10, a semiconductor package $P_2$ in accordance with a second preferred embodiment of the present invention includes a printed circuit board 1 having a electrical circuit formed therein, a plurality of semiconductor chips 2 spaced at fixed intervals substantially vertically attached to the printed circuit board 1 and gold balls 3 (not shown). The gold balls 3 are preferably conductive members that couple bonding pads 11 on each semiconductor chip 2 to pads 12 on the printed circuit board 1 similar to the first preferred embodiment shown in FIGS. 6C and 7. An encapsulate 13 is for molding the bonding pads 11 on each semiconductor chip 2 and the corresponding conductive connecting members. A heat dissipation cap 15 covers the printed circuit board 1 to enclose the semiconductor chips 2 and the encapsulate 13 and has heat dissipation openings 14 preferably in a central portion of selected opposing surfaces. Solder balls 5 of external connection terminals (not shown) are attached on an underside of the printed circuit board 1 for electrical connection to the semiconductor chips 2 through the electrical circuit in the printed circuit board 1.

Similar to the first preferred embodiment, the second preferred embodiment also includes the plurality of grooves 6 formed in an upper surface of the printed circuit board 1 each preferably receiving a lower end of each semiconductor chip 2 and having a depth of 180~420 μm based on the die bonding adhesive tape 7 attached on the bottom of the groove 6. The die bonding adhesive tape 7 of polyamide preferably has a thickness of 80~120 μm after compression. Further, there is an inter-chip adhesive tape 8 between chips 2 for serving as a buffer that prevents direct contact between the chips 2. The die bonding adhesive tape 7 and the inter-chip adhesive tape 8, being adhesive on both faces, may be formed of the same material or, in view of cost, different materials because an adhesive force between the chips 2 may be lower than the die bonding adhesive force. The heat dissipation cap 15 is preferably formed of copper, aluminum or their alloys, with anti-oxidation treated surfaces. The heat dissipation openings 14 formed in the heat dissipation cap 15 are made to communicate with spaces formed between the semiconductor chips 2.

A packaging method for the semiconductor package $P_2$ in accordance with the second preferred embodiment of the present invention will now be described, excluding die bonding, ball bonding and bonding between chips because these processes are similar to the first preferred embodiment. After completion of the ball bonding and the bonding between chips, a heat dissipation cap 15 is placed on the semiconductor chips 2 to cover the semiconductor chips 2 arranged on the printed circuit board 1.

Figure 11:
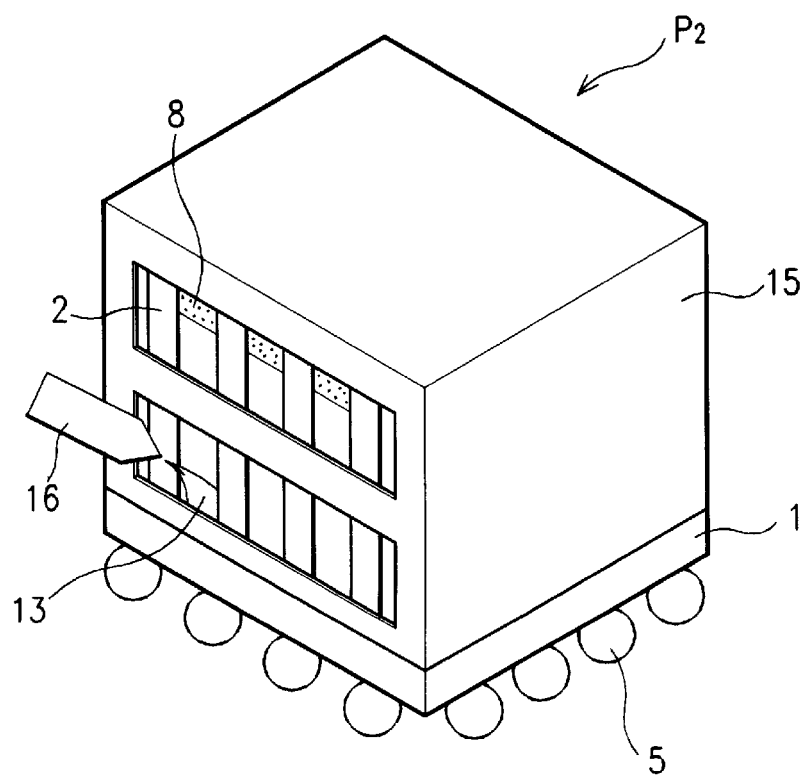
FIG. 11 is a diagram that illustrates a perspective view of an encapsulation process for a ball bonding part of the semiconductor package of FIG. 9.

As shown in FIG. 11, the ball bonding portions are protected by injecting a liquid encapsulate 13 through the heat dissipation openings 14 formed in a surface of the heat dissipation cap 15 using a potting nozzle 16. The encapsulate 13 is then hardened. Thus, in the semiconductor package $P_2$ in accordance with the second preferred embodiment of the present invention, the heat dissipation cap 15 has the heat dissipation openings 14 in communication with the spaces between the semiconductor chips 2.

Figure 12:
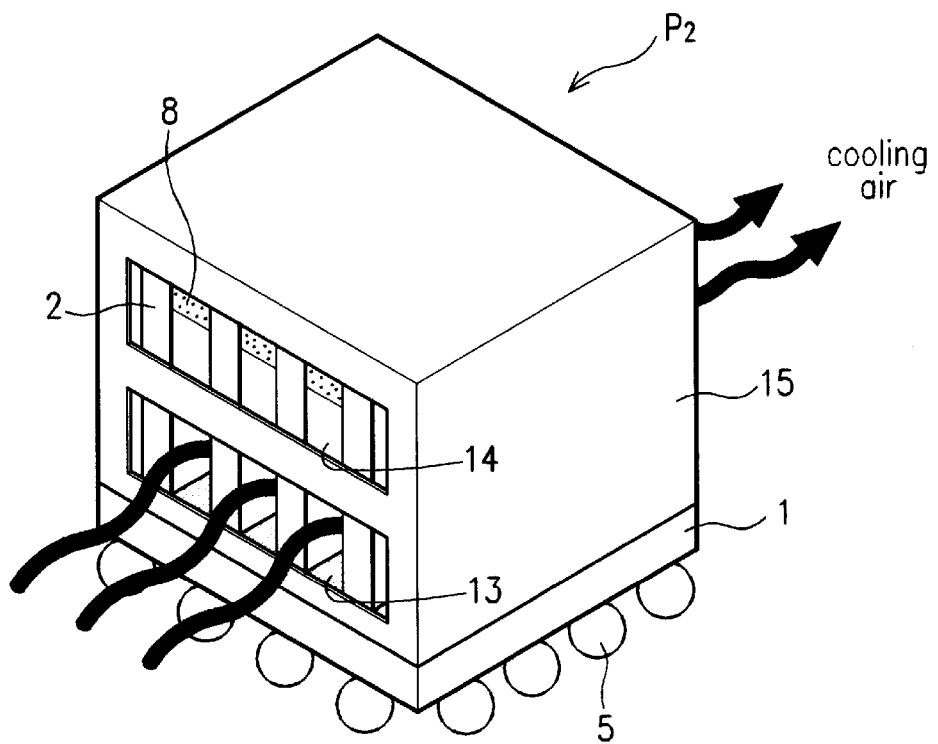
FIG. 12 is a diagram that illustrates another perspective view of the semiconductor package in FIG. 10.

As shown using arrows in FIG. 12, cold air or the like can flow through the heat dissipation openings 14 and pass through the spaces between the semiconductor chips 2 to cool down the semiconductor chips 2 when the semiconductor package $P_2$ is driven. Since heat generated inside of the semiconductor chips 2 is discharged outside of the package of direct heat exchange with the flowing cold air, the package has an increased heat dissipation capability. If a paste, such as epoxy resin, is used in place of the die bonding adhesive tape 7 in the die bonding of the first and second preferred embodiments, the paste is applied in the grooves 6 in the printed circuit board 1 before the die bonding. In this instance, since a wire bonding process follows directly after the die bonding process, the paste selected should be for snap cure and not for oven cure.

Figure 13:
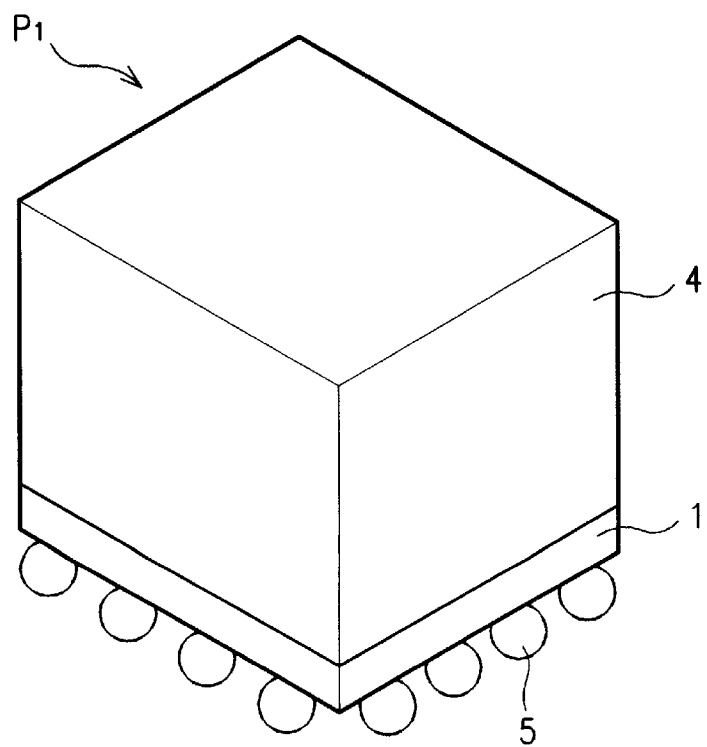
FIG. 13 is a diagram that illustrates a perspective view of a stacking type semiconductor package in accordance with a third preferred embodiment of the present invention.
Figure 14:
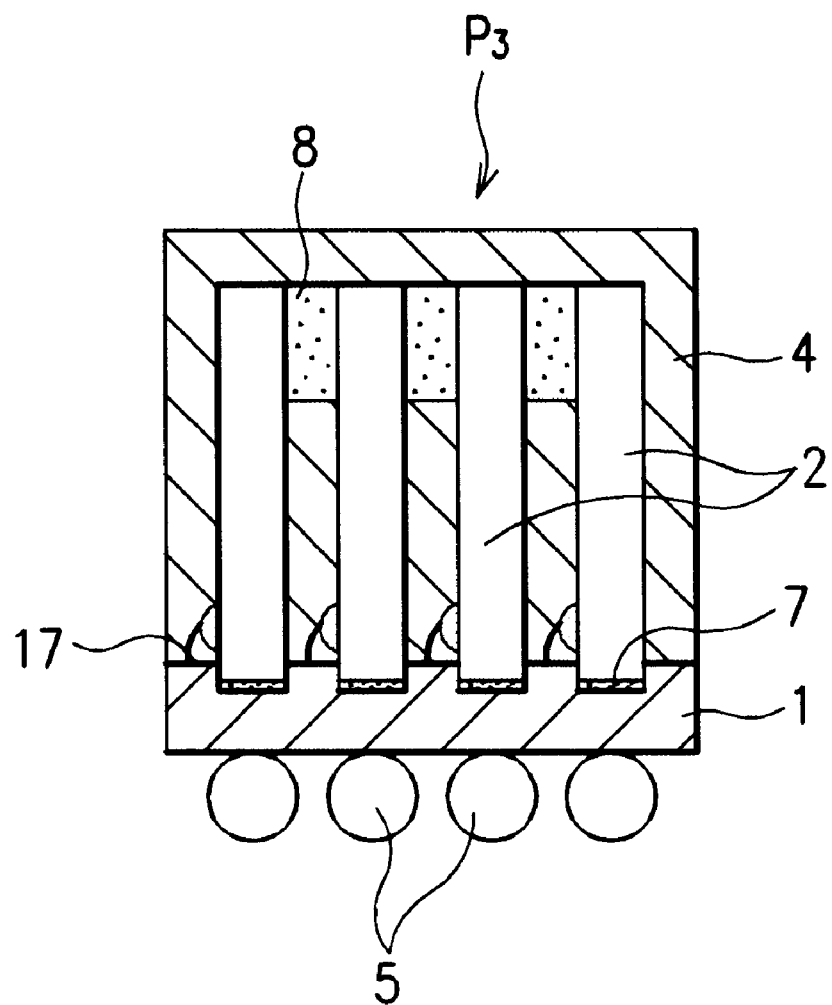
FIG. 14 is a diagram that illustrates a cross-sectional view of the semiconductor package of FIG. 13.

Referring to FIGS. 13 and 14, a semiconductor package $P_3$ in accordance with a third preferred embodiment of the present invention includes a printed circuit board 1 having a electrical circuit formed therein and a plurality of semiconductor chips 2 spaced at fixed intervals vertically attached to the printed circuit board 1. Gold wires 17, which are preferably conductive connecting members, connect bonding pads 11 on each semiconductor chip 2 to pads 12 on the printed circuit board 1. An encapsulation body 4 is for encapsulation of the semiconductor chips 2 and the conductive connecting members above the printed circuit board 1. Solder balls 5 of external connection terminals (not shown) are attached on underside of the printed circuit board 1 for electrical connection to the semiconductor chips 2 through a circuit in the printed circuit board 1. Similar to the first and second preferred embodiments, the third preferred embodiment also includes the plurality of grooves 6 formed in an upper surface of the printed circuit board 1 each receiving a lower end of a corresponding semiconductor chip 2. The depth of the grooves 6 and the thickness and material of the die bonding adhesive tape 7 attached in the grooves 6 are preferably similar to the first and second preferred embodiments. The inter-chip adhesive tapes 8 to buffer between chips 2 and prevent direct contact between chips 2 is also preferably the same as the first and second preferred embodiments.

Figure 15A:
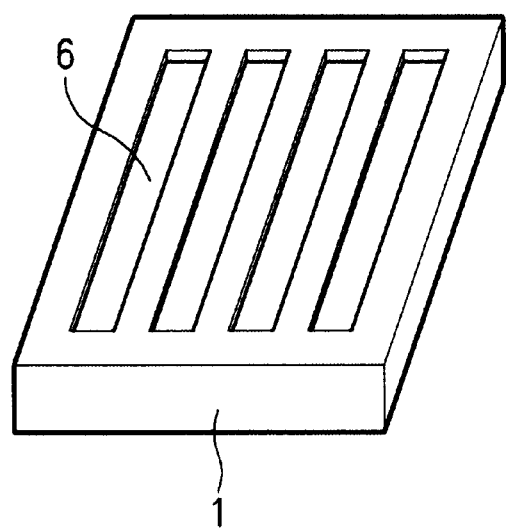
Figure 15B:
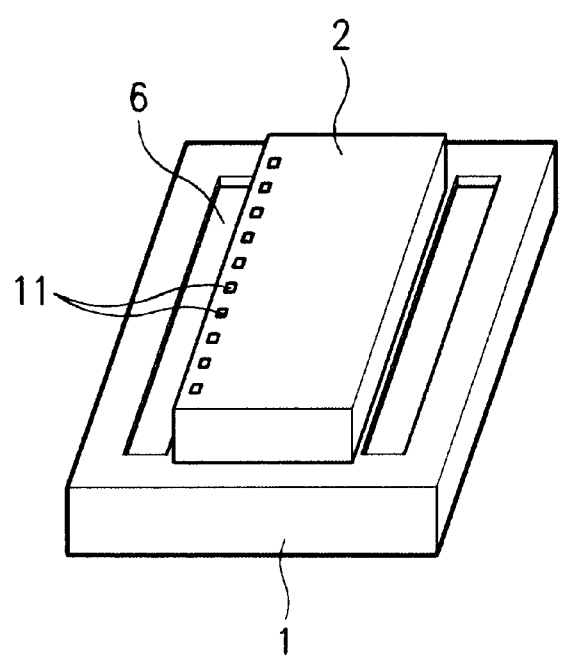

A packaging method of the semiconductor package $P_3$ in accordance with the third preferred embodiment of the present invention will now be described. A printed circuit board 1 is provided as shown in FIG. 15*a*. The printed circuit board 1 has grooves 6 each for bonding a semiconductor chip 2 substantially vertical to a board surface. A die bonding adhesive tape 7 is attached on a bottom of the groove 6. As shown in FIG. 15*b*, the printed circuit board 1 with a first semiconductor chip 2 thereon is placed on a pre-heating plate 100 and heated to process wire bonding. Bonding pads 11 on the semiconductor chip 2 and pads 12 on the printed circuit board 1 are bonded with gold wires 17, which are conductive connecting members. Because the die bonding adhesive tape 7 attached to the groove 6 is preferably hardened to be adhesive at a temperature of 400° C., which is a peak temperature and the wire bonding is carried out at a temperature of 200° C., none of the semiconductor chips 2 are attached to the die bonding adhesive tape 7 during the wire bonding.

Figure 15C:
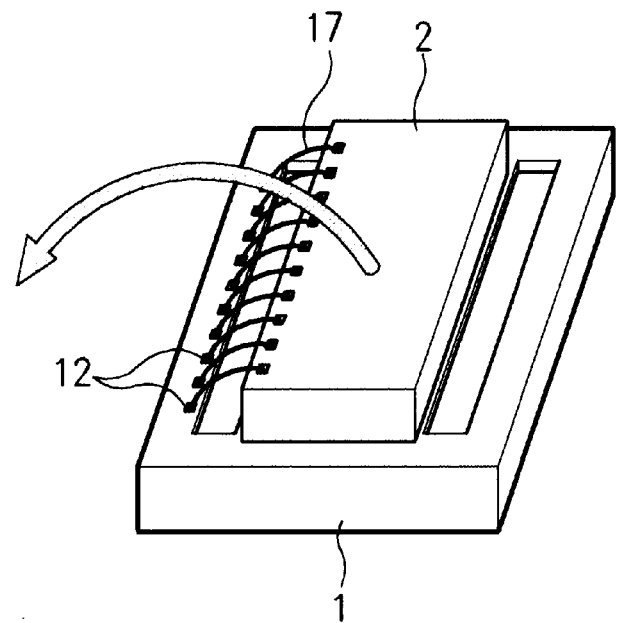
Figure 15D:
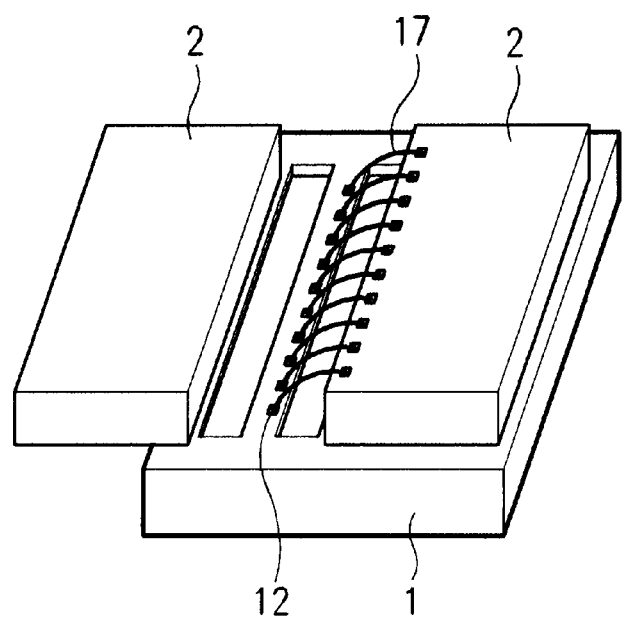
Figure 15E:
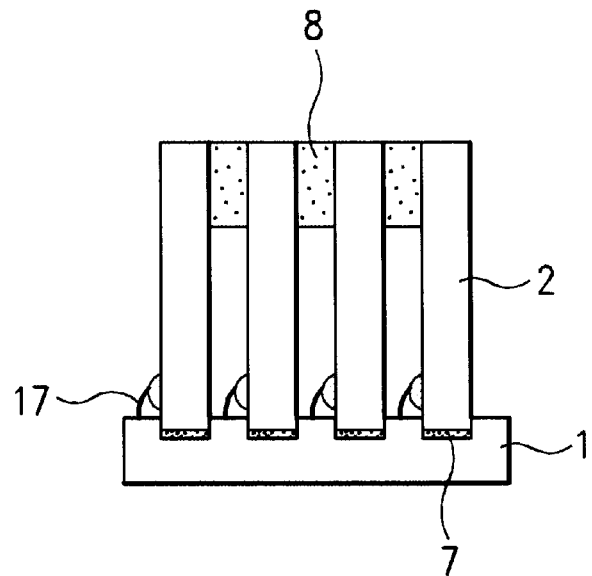
Figure 15F:
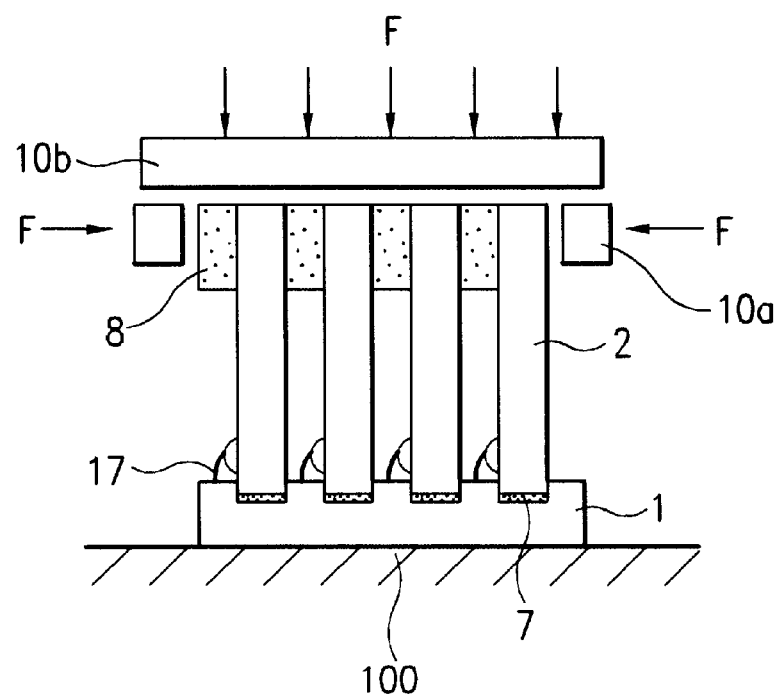

As shown in FIG. 15*c*, upon completion of wire bonding of the first semiconductor chip 2, the first semiconductor chip 2 is turned over (e.g., horizontally flipped). Then, a second semiconductor chip 2 is placed, and the wire bonding is performed to electrically couple the bonding pads 11 on the second semiconductor chip 2 and the pads 12 on the board 1. In the wire bonding process and the turning over of the bonded semiconductor chips, which occur as many times as a number of the semiconductor chips 2, problems such as the wires breaking do not occur even after the semiconductor chips are vertically bonded because the gold wire 17 is highly ductile. Upon completion of wire bonding for all semiconductor chips, all the semiconductor chips 2 are brought to vertical and heated as shown in FIG. 15*e*. The semiconductor chips 2 are pressed down using an upper pressing board 10*b*, which is preferably a jig, and compressed from left and right sides using left and right compressing plates 10*a* as shown in FIG. 15*f*. Preferably, the bonding between the chips 2 and bonding the chips 2 on the board 1 occurs at the same time.

Figure 15G:
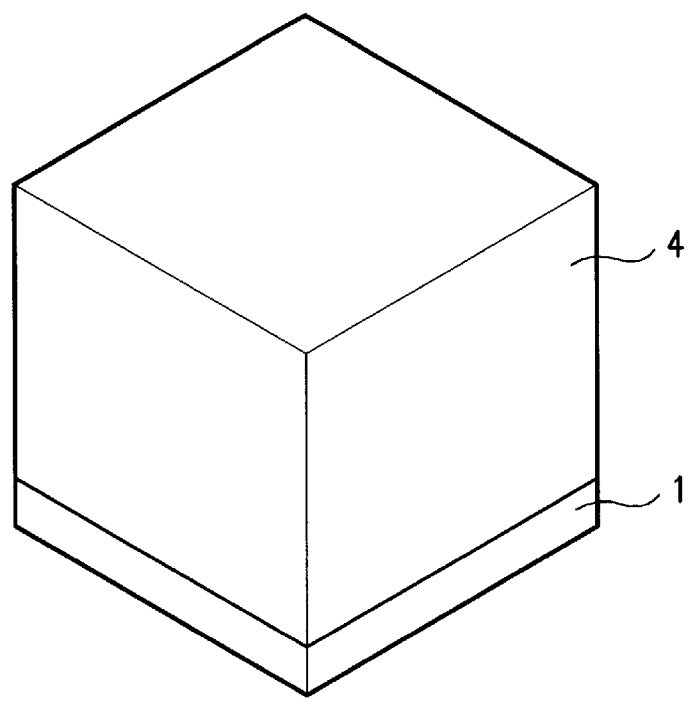
Figure 15H:
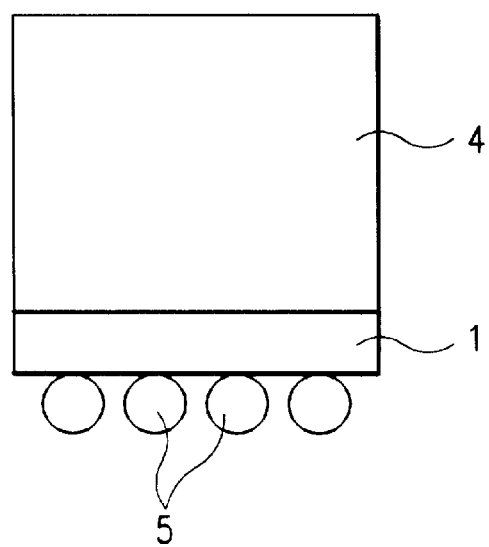

Similar to the first and second preferred embodiments, the bonding between the chips 2 are facilitated by the inter-chip bonding adhesive tape 8 attached on upper parts of the chips 2. After completion of the bonding between the chips 2, an encapsulate resin encapsulates the stacked semiconductor chips 2, the gold wires 17 and the bonded portions, to form an encapsulation body 4 as shown in FIG. 15*g*. The encapsulation body 4 protects the stacked semiconductor chips 2, the gold wires 17 and the bonded portions. In the third preferred embodiment, the encapsulate resin fills spaces between the chips 2. After completion of the encapsulation of the semiconductor chips 2, the gold wires and the bonded portions, solder balls 5 are mounted on underside of the board 1 as shown in FIG. 15*h*.

Figure 16:
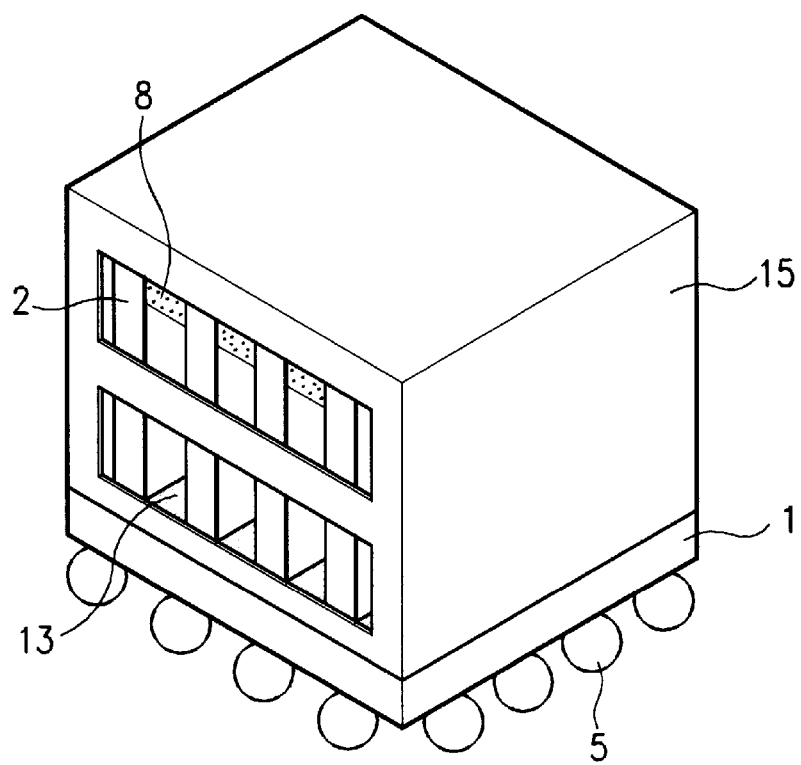
FIG. 16 is a diagram that illustrates a perspective view of a stacking type semiconductor package in accordance with a fourth preferred embodiment of the present invention.
Figure 17:
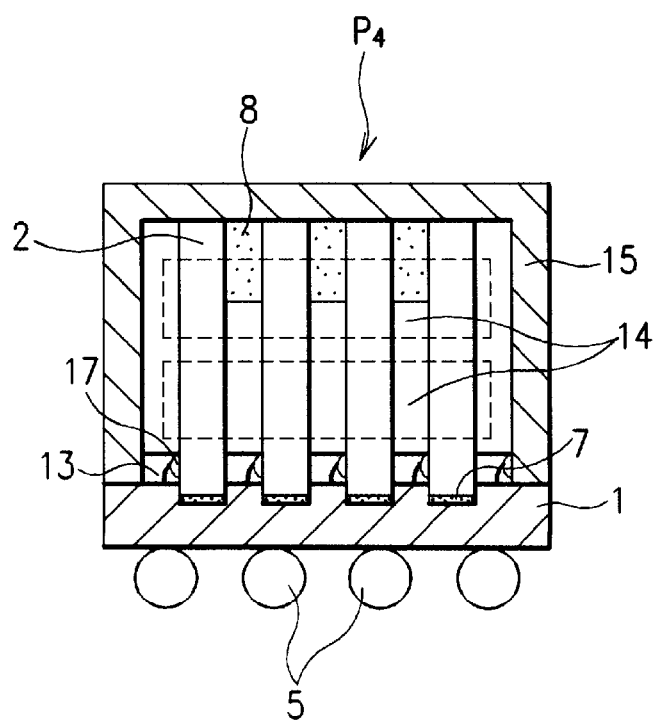
FIG. 17 is a diagram that illustrates a cross-sectional view of the semiconductor package of FIG. 16.

Referring to FIGS. 16 and 17, a semiconductor package $P_4$ in accordance with the fourth preferred embodiment of the present invention includes a printed circuit board 1 having a electrical circuit formed therein and a plurality of semiconductor chips 2 vertically attached at fixed intervals to the printed circuit board 1. Gold wires 17, which are preferably conductive connecting members, connect bonding pads 11 on each semiconductor chip 2 to pads 12 on the printed circuit board 1. An encapsulate 13 encapsulates the bonding pads on each semiconductor chip 2 and the corresponding conductive connecting members. A heat dissipation cap 15 is covered on the printed circuit board 1 to enclose the semiconductor chips 2 and the encapsulate 13. The heat dissipation cap 15 has heat dissipation openings 14 preferably in a central portion of selected opposing faces. Solder balls 5 of external connection terminals (not shown) are attached on an underside of the printed circuit board 1 for electrical connection to the semiconductor chips 2 through the electrical circuit in the printed circuit board 1. The fourth preferred embodiment includes a plurality of grooves 6 formed in an upper surface of the printed circuit board 1 that each receive a lower end of a corresponding semiconductor chip 2. A depth of the groove 6, a thickness and material of the die bonding adhesive tape 7 and the inter-chip adhesive tape 8 are similar to the first, second and third preferred embodiments. The die bonding adhesive tape 7 and the inter-chip adhesive tape 8, being adhesive on both faces, may be formed of the same material or, in view of cost, different materials because an adhesive force between the chips 2 may be lower than the die bonding adhesive force. Similar to the second embodiment, the heat dissipation cap 15 is preferably formed of copper or aluminum or their alloys and has anti-oxidation treated surfaces. Further, the heat dissipation openings 14 formed in the heat dissipation cap 15 are made to communicate with spaces formed between the semiconductor chips 2.

Figure 18:
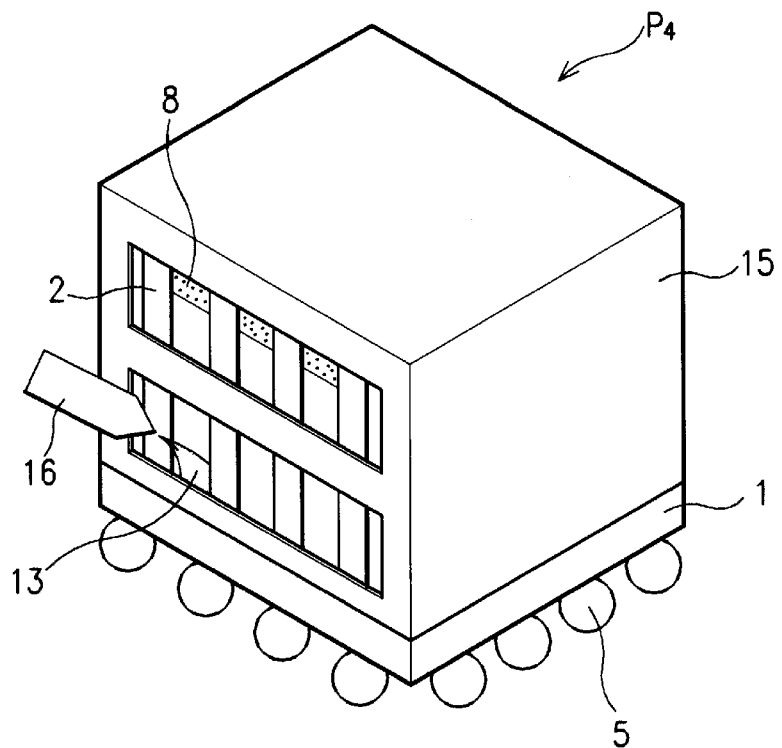
FIG. 18 is a diagram that illustrates a perspective view of encapsulating the semiconductor package of FIG. 16; and, FIG. 19 is a diagram that illustrates a perspective view of heat dissipation in the semiconductor package of FIG. 16.

A packaging method for the semiconductor package $P_4$ in accordance with the fourth preferred embodiment of the present invention will now be described, omitting the die bonding, the wire bonding and the bonding between chips because these processes are similar to the third preferred embodiment. After completion of the wire bonding and bonding between chips, a heat dissipation cap 15 is capped on the semiconductor chips 2 on the printed circuit board 1. As shown in FIG. 18, the bonding portions are protected by injecting a liquid encapsulate 13 using a potting nozzle 16 through the heat dissipation openings 14 formed in selected opposite faces of the heat dissipation cap 15 and hardening the encapsulate 13. Thus, in the semiconductor package $P_4$ in accordance with the fourth embodiment of the present invention, the heat dissipation cap 15 has the heat dissipation openings 14 in communication with the spaces between the semiconductor chips 2.

Figure 19:
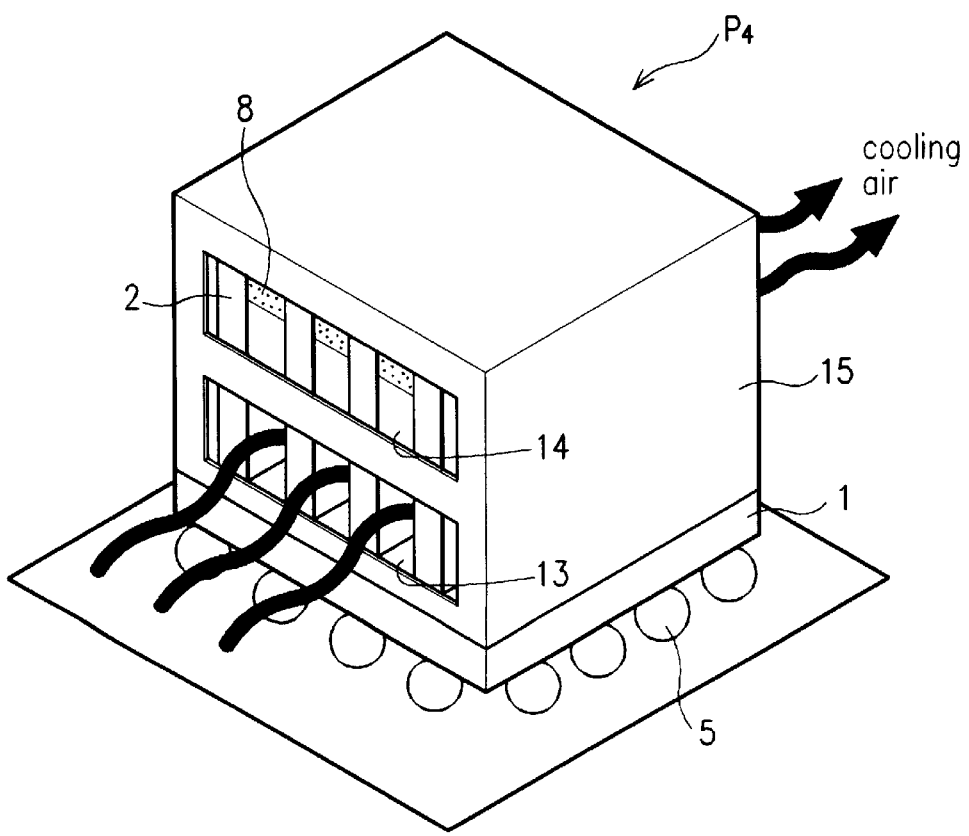

As shown in arrows in FIG. 19, cold air can flow through the heat dissipation openings 14 and pass through the spaces between the semiconductor chips 2 to cool the semiconductor chips 2 when the semiconductor package $P_4$ is driven. Since heat generated inside of the semiconductor chips 2 is discharged outside of the package by means of direct heat exchange with the flowing cold air, the package has an increased cooling capability. If a paste, such as epoxy resin, is used in place of the die bonding adhesive tape 7 in the die bonding of the third and fourth preferred embodiments, the paste is preferably applied in the grooves 6 in the printed circuit board 1 before carrying out the die bonding that comes after the wire bonding. In this instance, since there is a pre-heating process for processing the wire bonding, the paste selected should be for oven cure and not for snap cure.

As described above, the preferred embodiments according to the present invention have various advantages. The semiconductor package and method of making same of the preferred embodiments obtain a package with an increased device packing density and extremely short signal transmission paths. Thus, the preferred embodiments provide a fast response time for a device package with an increased performance. As the present invention does not stack individual packages after an individual packaging process, but stacks the chips at the same time with the packaging, a production time can be shortened. Since the successive die bonding and wire bonding allows a simple, faster fabrication process, and the employment of a process with a low cost and a high reliability, the semiconductor package and method provide production at a lower cost and a faster speed. A time required for processing (e.g., a TAT) can be reduced. Further, a productivity can be increased. In addition, the semiconductor packages according to the preferred embodiments of the present invention have increased heat dissipation capabilities because heat is discharged through a heat dissipation cap by heat exchange in convection between a semiconductor chip surface and a cooling gas or liquid.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. It is intended that the present invention cover the modifications and variations of this invention that are within the scope of the appended claims and their equivalents.

What is claimed is:

1. A semiconductor package comprising:
    a printed circuit board, wherein an electrical circuit is formed in the printed circuit board;
    a plurality of semiconductor chips substantially vertically attached to the printed circuit board, wherein the printed circuit board has a plurality of grooves that each receives an end of a corresponding one of the semiconductor chips, and wherein the grooves are respectively separated by a constant prescribed distance;
    conductive members that respectively couple bonding pads on each the semiconductor chips to pads on the printed circuit board, wherein the conductive members are gold balls, and wherein a depth of the grooves is substantially equal to a distance from an edge of the semiconductor chip to a bonding pad on the semiconductor hip;
    an encapsulation body that packages the semiconductor chips and the conductive members above the printed circuit board; and
    terminals on a bottom surface of the printed circuit board that are electrically coupled to the semiconductor chips through the pads on the printed circuit board and the electrical circuit in the printed circuit board.

2. The package of claim 1, further comprising an inter-chip adhesive tape between each of the semiconductor chips that prevents contact between vertically adjacent chips on the printed circuit board, and wherein the terminals include solder balls.

3. The package of claim 1, wherein at least one of a die bonding adhesive tape and a die bonding paste is on a bottom of the grooves in the printed circuit board.

4. The package of claim 1, wherein the encapsulation body comprises:
    an encapsulate that encloses the bonding pads and the conductive members; and
    a heat dissipation cap attached to the printed circuit board that encloses the semiconductor chips and the encapsulate.

5. The package of claim 4, wherein heat dissipation cap is formed of at least one of copper, aluminum and alloys of copper and aluminum, wherein a surface of the heat dissipation cap is anti-oxidation treated, and wherein the heat dissipation cap has heat dissipation openings in selected opposing faces.

6. The package of claim 1, further comprising an encapsulate that forms a top and both ends of the encapsulation body, wherein the encapsulate encloses top surfaces of the semiconductor chip while exposing front and back surfaces of the semiconductor chips, and wherein the encapsulate encloses the bonding pads and the conductive members to cover a top surface of the printed circuit board exposed between the semiconductor chips.

7. The package of claim 6, wherein the encapsulate and the semiconductor chips define a plurality of conduits from a front surface of the semiconductor package to a back surface of the semiconductor package.

8. The package of claim 7, further comprising a heat dissipation cap attached to the printed circuit board that covers a top and end surfaces of the encapsulate, wherein the heat dissipation cap has a horizontal bar across the front and back surfaces that subdivide the conduits.

* * * * *